United States Patent [19]

Frank et al.

[11] 3,955,142
[45] May 4, 1976

[54] SINGLE-SIDEBAND RADIOTELEPHONE SYSTEM

[75] Inventors: Varn Richard Frank, Miamisburg; Ronald Eugene Wysong, Centerville; Michael David Valentine, Cincinnati, all of Ohio

[73] Assignee: R. L. Drake Company, Miamisburg, Ohio

[22] Filed: Mar. 6, 1975

[21] Appl. No.: 556,136

[52] U.S. Cl................................ 325/50; 325/329; 325/470
[51] Int. Cl.² .......................................... H04B 1/68
[58] Field of Search ............................ 325/49–51, 325/53, 55, 64, 470, 329, 330, 302, 308, 332–335, 137, 138, 392, 466, 467; 179/41 A; 340/171 R

[56] References Cited
UNITED STATES PATENTS

| | | | |
|---|---|---|---|
| 3,320,535 | 5/1967 | Broadhead | 325/50 X |
| 3,597,690 | 8/1971 | Wycoff | 325/64 |
| 3,716,790 | 2/1973 | Romoser | 325/55 X |
| 3,771,060 | 11/1973 | Wycoff | 325/50 |
| 3,818,368 | 6/1974 | Wycoff | 325/55 X |
| 3,840,811 | 10/1974 | Blouch | 325/55 |
| 3,867,700 | 2/1975 | Wycoff | 325/55 X |

*Primary Examiner*—Benedict V. Safourek
*Assistant Examiner*—Robert Hearn
*Attorney, Agent, or Firm*—Biebel, French & Nauman

[57] ABSTRACT

A single-sideband radiotelephone system includes a single-sideband transmitter which initially broadcasts two frequency-spaced tones simultaneously for a predetermined time interval, and thereafter broadcasts the two tones alternately in a unique code pattern to access a predetermined receiver. Each single-sideband receiver in the system includes a pair of detectors each having a narrow bandpass, the center frequencies of which are spaced apart by the difference in frequency of the transmitted tones. The center frequencies of the detectors are simultaneously varied relative to the initial two-tone broadcast while maintaining the frequency differential therebetween; and simultaneous detection of both tones will terminate the frequency varying mode of operation. The subsequently transmitted unique code pattern is then sensed by the detectors, the code pattern decoded, and the selected receiver is enabled to receive any subsequently broadcasted information.

11 Claims, 4 Drawing Figures

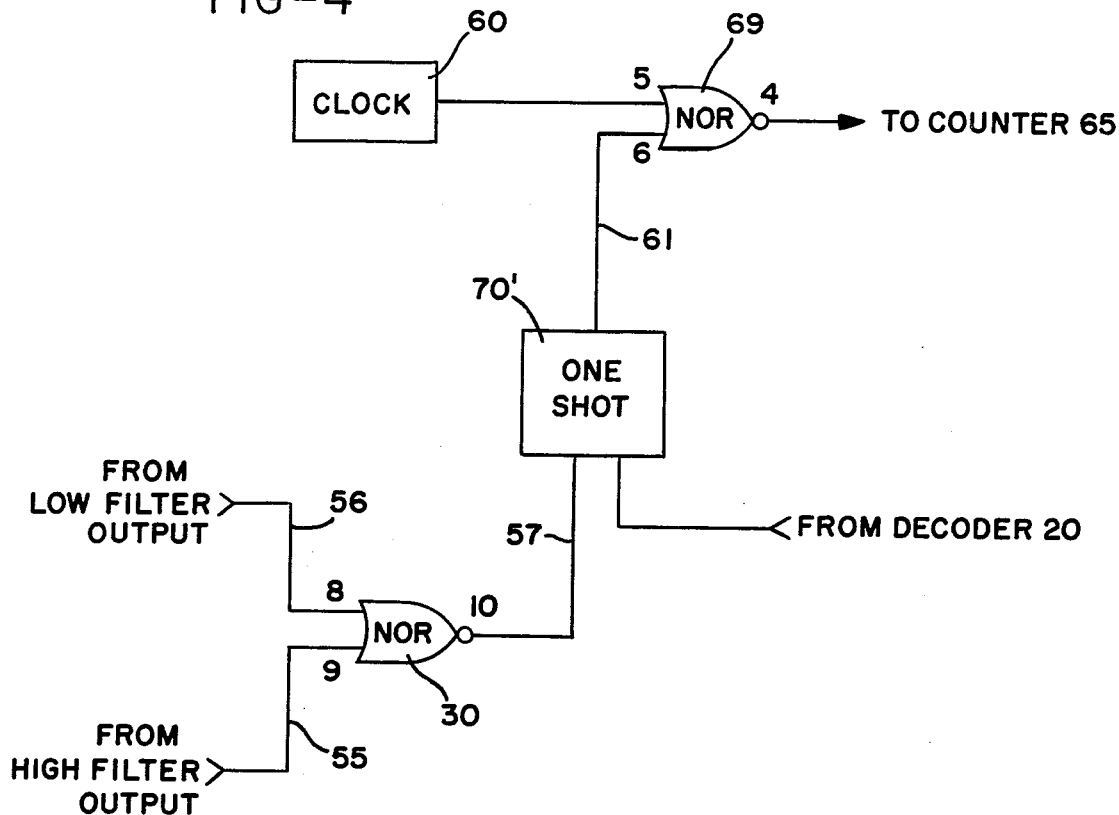

SINGLE-SIDEBAND RADIOTELEPHONE SYSTEM

BACKGROUND OF THE INVENTION

This invention relates to a single-sideband radiotelephone system including at least one single-sideband transmitter and a plurality of single-side-band receivers.

As is well known, a single-sideband transmitter is designed to broadcast amplitude modulated information on a selected one of the two primary sidebands of an amplitude modulated carrier while suppressing the other sideband as well as the carrier. Since no carrier exists in the transmitted signals, a reinserted carrier is provided by a receiver, and it is with reference to this reinserted carrier that the sideband information is demodulated. The quality and frequency response of the demodulated signal depends on how accurately the frequency of the reinserted carrier is aligned with reference to the original, but now suppressed carrier. Therefore, determination of the proper insertion carrier frequency is essential if a single-sideband signal is to be demodulated accurately.

Usually, the stability of transmitters and the receivers is high enough to provide reasonably acceptable quality of voice communications. Some receivers are provided with a "clarifier" control which permits the operator to make minor adjustments in the insertion carrier frequency should the transmitter and receiver frequencies differ slightly.

There are several prior art systems which attempt to establish the proper insertion carrier frequency, one of which is shown in U.S. Pat. No. 3,716,790. In the device shown in that patent, a two-frequency tone is broadcasted continuously. For example, a F1 frequency tone is broadcast simultaneously with a selected one of an F2-F6 frequency tone. At the receiver, these two tones interact in the intermediate frequency (IF) and audio stages to produce a single audio tone having a frequency equal to the frequency difference between the two transmitted tones. The detected audio tone is independent of the frequency of the insertion carrier, and may be used as a guide in tuning the receiver. This system is wasteful of power and bandwidth in that the two frequency tones must be broadcast simultaneously during transmission of any information but do not carry any information other than to establish the proper insertion carrier frequency.

In a radiotelephone system, as well as in other systems, such as a radioteletype, a preselected receiver is accessed by means of tone coded signals which precede the broadcast of audio information. It is essential that these tone coded signals be detected and decoded properly if the preselected receiver is to be activated. In order to detect the tone coded signals, however, the detectors or filters used in the receiver will have a limited band-pass in order to provide sufficient selectivity. Therefore, the receivers must be tuned accurately in order to place the tone coded signals within the band-pass of the detectors or filters.

It is recognized, however, that within the frequency bands normally used by the radiotelephone service, frequency stability of ±0.01% for the transmitter is acceptable. Assuming a 2 MHz carrier signal, the carrier may therefore vary in frequency ±200 Hz. A similar variation in the frequency stability of the receiver could result in a total variation in the received signals of ±400 Hz. By way of example, if a single 1300 Hz audio tone were to be broadcasted, this tone could be demodulated at a receiver as a tone ranging in frequency from 900 to 1700 Hz.

Audio filters or detectors of the type normally used in receivers for this purpose have a band-pass of 8 to 10% of its center frequency or ±130 Hz, in the example given. It is therefore clear that a filter with a band-pass this narrow might not detect a 1300 Hz tone at all times, even assuming the permissable frequency variation in the transmitter.

SUMMARY OF THE INVENTION

The present invention relates to a single-sideband radio system which may be used for radiotelephone, radioteletype or for other uses in which at least two audio detectors or filters are employed, the center frequencies of which are varied relative to at least two frequency-spaced tones transmitted simultaneously for a predetermined interval in order to place the transmitted frequency-spaced tones within a band-pass of the detectors or filters.

A single-sideband transmitter includes means for broadcasting initially at least two frequency-spaced tones simultaneously for a predetermined time interval. Thereafter, these same frequency-spaced tones are broadcast alternately in a unique code pattern to access a predetermined receiver, in the case of a radiotelephone system, or to convey information, in the case of a radioteletype system.

Each single-sideband receiver in the system includes at least two detectors or filters, the center frequencies of which are frequency-spaced the same as the frequency-spaced transmitted tones. Scanning or sweep control means are included to vary the center frequencies of the detectors or filters relative to the two frequency-spaced tones while maintaining the difference in frequency between the filters. In a preferred embodiment of the invention, frequency adjustable detectors or filters are used.

The outputs of the detectors or filters are connected to a gate which senses when the two frequency-spaced signals are detected simultaneously, and an output from the gate will terminate the operation of the scanning means. Other circuit means are provided to decode the subsequently broadcasted unique code patterns.

The receiver means may comprise two adjustable filters, each capable of providing an output in response to an input audio tone within its respective frequency band. These filters may be of the phase locked loop type, responsive to a frequency band determined by the values of impedances connected thereto.

The sweep control means comprises means for varying the bandpass center frequency of each of the two adjustable filters in a predetermined number of steps, the bandpass at each step overlapping that of the previous step and next succeeding step. The control means accomplishes bandpass center frequency variation by connecting predetermined ones of a plurality of impedances to the two adjustable filters. Means for connecting these impedances is responsive to a counter which cycles through its succesive states in response to receipt of clock pulses. Application of these clock pulses to the counter is controlled by a NOR gate. The NOR gate discontinues application of clock pulses to the counter upon receipt of a signal from the gate means, indicating that the filter means are properly adjusted.

Accordingly, it is an object of this invention to provide a single-sideband receiver capable of receiving and processing information contained in a series of alternations between two frequencies.

It is a further object of this invention to condition a single-sideband receiver such that a plurality of narrow bandpass filters contained therein will be responsive to a plurality of frequencies.

It is also an object of this invention to provide a single-sideband system in which the receiver is automatically tuned and in which high selectivity is maintained.

Other objects and advantages of the invention will be apparent from the following description, the accompanying drawings and the appended claims.

BRIEF DESCRIPTION OF THE DRAWINGS

FIG. 4 is a schematic representation of a modification of the frequency sweep control of FIG. 3.

DESCRIPTION OF THE PREFERRED EMBODIMENT

Figure 1:
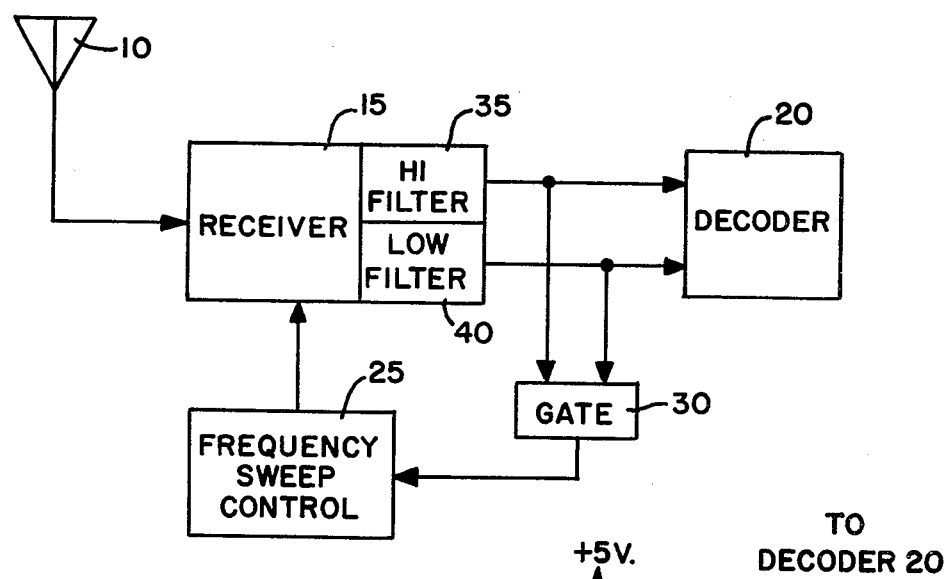
FIG. 1 is a diagrammatic representation of the preferred embodiment.

Referring to FIG. 1 of the drawings, there is shown a diagrammatic representation of the preferred embodiment of the instant invention. The preferred embodiment comprises a single-sideband system for adjusting a single-sideband receiver to enable it to sense a sequence of alternations between two tones broadcast by a single-sideband transmitter, where the two tones ar initially broadcast simultaneously. An antenna 10 provides signals received to sideband receiver 15.

The receiver 15, including a first and second means for scanning a range of frequencies comprising filters 35 and 40, is selectively responsive to two frequency bands, each of these bands having a center frequency. A decoder 20 is responsive to receiver 15 to decode the sequence of alternations between the two frequency bands. The two frequency bands to which the receiver is responsive may be adjusted under the control of frequency sweep control 25. These frequency bands are varied simultaneously in a cyclic manner such that the center frequencies of the two bands remain a constant frequency differential apart.

A gate 30 is provided to detect the simultaneous reception by receiver 15 of signals in the two frequency bands to which the receiver is then responsive. Gate 30 will sense this simultaneous reception when the receiver 15 is properly conditioned by control 25 and will supply a signal to control 25 to halt further variation of the frequency bands.

Figure 2:
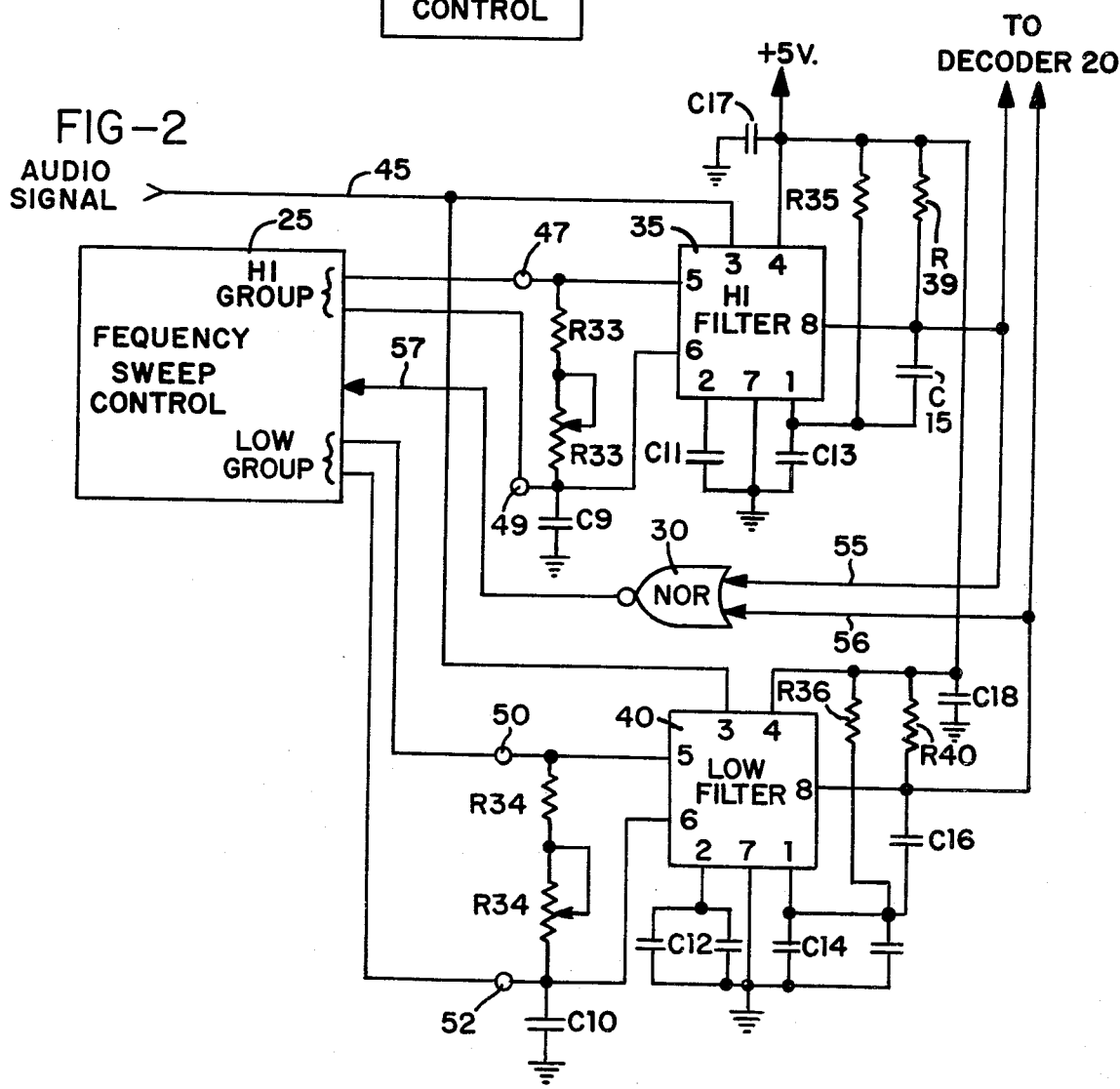
FIG. 2 is a schematic representation of a portion of the preferred embodiment, showing the two adjustable filters in greater detail.

Referring now to FIG. 2 of the drawings, a portion of the preferred embodiment of the invention is illustrated in greater detail. Specifically, the HI and LOW filters, 35 and 40, of receiver 15 and their associated circuitry are shown more fully. These filters may typically comprise phase locked loop filters such as integrated circuit NE567 available from Signetics Corp., Sunnyvale, California. The NE567 device, when properly controlled, will act as a filter which provides a zero level signal at its output (pin 8) when an appropriate signal is supplied to its input (pin 3). The bandwidth and center frequency of this device are controlled by connection of appropriately valued impedances to its control terminals. Specifically, the center frequency, $f_o$, is specified by the value of resistance applied between pins 5 and 6 and the value of capacitance connected between pin 6 and ground. The value of capacitance connected between pin 2 and ground determines the bandwidth of the filter.

Filters 35 and 40 receive audio inputs on line 45. The center frequency of HI filter 35 is specified by resistor $R_{33}$ and capacitor $C_9$ and is approximately equal to $$\frac{1}{R_{33}C_9}.$$

Alteration of the center frequency is effected by frequency sweep control 25 by connecting additional impedances between nodes 47 and 49 and between node 49 and ground. Low filter 40 is similarly adjusted by connecting appropriate impedances between nodes 50 and 52, and between node 52 and ground. When both HI filter 35 and LOW filter 40 simultaneously receive signals within their respective bandpass frequencies, a first gate means comprising NOR gate 30 will receive a "low" signal on lines 55 and 56. This will result in a "high" signal being applied to frequency sweep control 25 via line 57. Adjustment of filter frequency will then be halted and decoder 20 will decode the frequency alternations subsequently received.

As mentioned previously, the capacitance connected to pin 2 of the NE567 circuit controls filter bandwidth. Bandwidth is approximately equal to $1070 \sqrt{V_i/f_oC}$ in % of $f_o$, where $V_i$ equals the input voltage and C equals the capacitor attached to pin 2. Thus, in the circuit of FIG. 2, capacitors $C_{11}$ and $C_{12}$ are determined in this manner.

Capacitors $C_{13}$ and $C_{14}$ are generally not critical in value. These capacitances set the band edge of low pass filters which attenuate frequencies outside the detection band to eliminate spurious outputs. If these capacitors are too small, frequencies just outside the detection band will switch the output stage of the unit on and off at the beat frequency. If these capacitors are too large, the output stages will be delayed in operation. A typical value for the capacitance connected between pin 1 and ground is twice the capacitance connected between pin 2 and ground. Resistors $R_{39}$ and $R_{40}$ are load resistors and typically they approximate 20 K.

Figure 3:
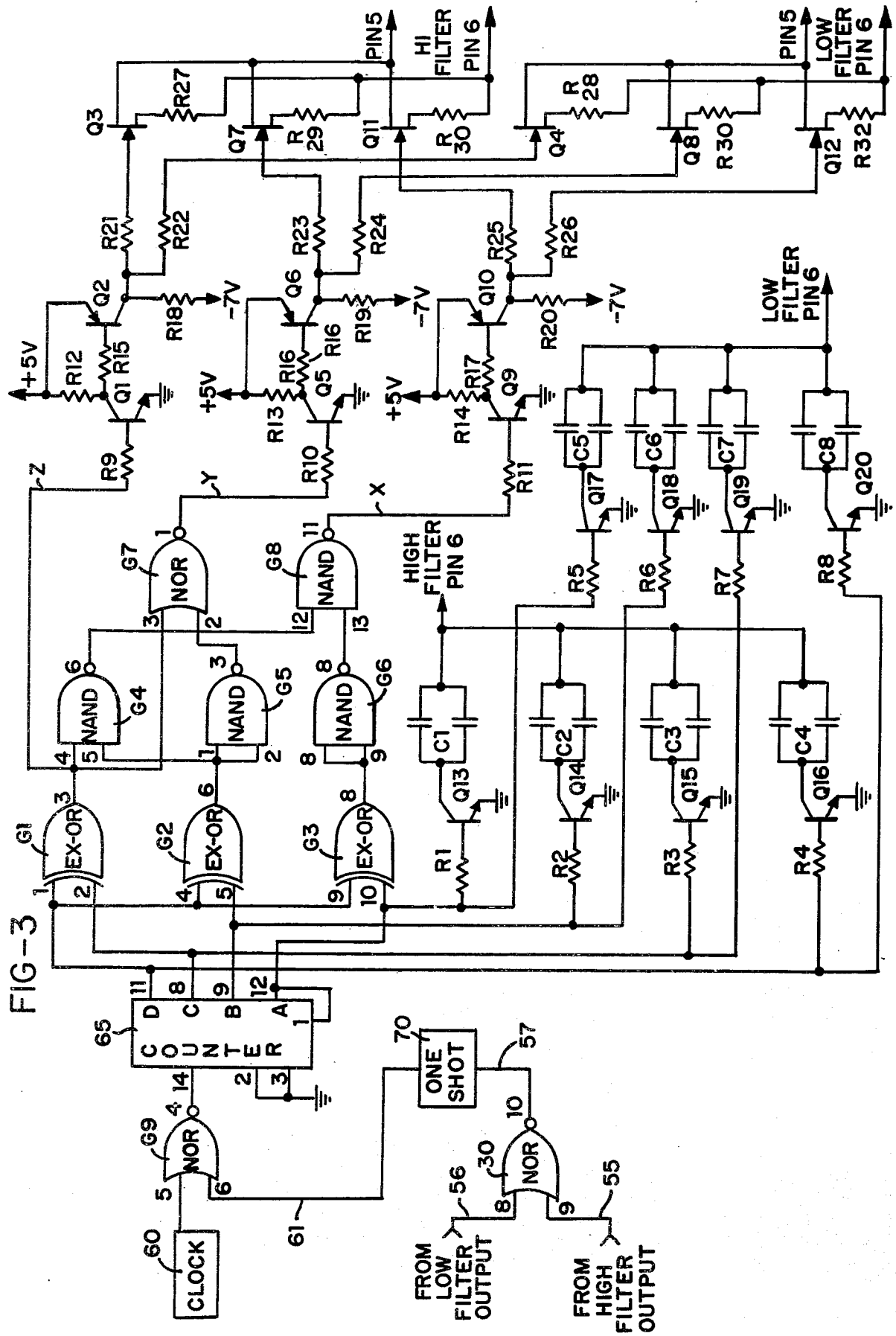
FIG. 3 is a schematic representation of the frequency sweep control of the preferred embodiment.

Turning now to FIG. 3, there is shown in more detail the frequency sweep control 25. A clock 60 provides a series of clock pulses at a predetermined frequency to a second gate means comprising NOR gate G9. As long as no signal is provided on line 61, the output of NOR gate G9 will be an inverted version of the clock pulses. Binary counter 65 will cycle through its counting sequence in response to the clock pulses received from gate G9. Counter 65 in the preferred embodiment of the invention typically will comprise a SN7493 counter available from numerous sources, including Texas Instruments Incorporated, Dallas, Texas. Such a counter will function to cycle through 16 binary states with the A output corresponding to the least significant digit and the D output corresponding to the most significant digit.

A third gate means is responsive to the counter output to connect predetermined ones of a plurality of impedances to the HI and LOW filters to cyclically adjust the frequencies to which these filters are responsive. The impedances comprise capacitors $C_1$-$C_8$ and resistors $R_{27}$-$R_{32}$. The third means includes gates G1-G8, transistors $Q_1$-$Q_{20}$, and associated circuitry.

The cyclic operation of counter 65 acts to connect various ones of capacitors $C_1$ through $C_4$ between pin 6 of the HI filter and ground and to connect various ones of capacitors $C_5$ through $C_8$ between pin 6 of the LOW filter and ground. This connection is controlled by transistors $Q_{13}$ through $Q_{20}$. Positive output signals on outputs A through D of counter 65 will result in 2 or more of these transistors being turned on. The center frequencies of HI filter 35 and LOW filter 40 will thus be decreased as the capacitances connected to the filters are increased.

In order that the center frequency of filters 35 and 40 be varied in a linear manner, predetermined ones of a plurality of resistors are selectively connected to the HI and LOW filters. EXCLUSIVE-OR gates G1 through G3 typically comprise integrated circuit SN7486, available from Texas Instruments Incorporated, Dallas, Texas. NAND gates G4, G5, G6 and G8 will typically comprise integrated circuit SN7400, available from Texas Instruments Incorporated. NOR gates G7 and 30 are also available from Texas Instruments Incorporated in the form of circuit SN7402.

Gates G1 through G8 function to provide signals X, Y, and Z to transistors $Q_1$, $Q_5$, and $Q_9$ so as to connect resistors $R_{27}$ through $R_{32}$ in parallel with $R_{33}$ and $R_{34}$ in such a manner as to linearize the succession of frequencies swept by the filters. The signals X, Y, and Z, which are provided in response to the outputs A through D of counter 65 are illustrated in Table I.

TABLE I

| Count No. | Counter 65 | | | | | | |
|---|---|---|---|---|---|---|---|
| | A | B | C | D | X | Y | Z |
| 0 | 0 | 0 | 0 | 0 | 0 | 0 | 0 |
| 1 | 1 | 0 | 0 | 0 | 1 | 0 | 0 |
| 2 | 0 | 1 | 0 | 0 | 0 | 1 | 0 |
| 3 | 1 | 1 | 0 | 0 | 1 | 1 | 0 |
| 4 | 0 | 0 | 1 | 0 | 0 | 0 | 1 |
| 5 | 1 | 0 | 1 | 0 | 1 | 0 | 1 |
| 6 | 0 | 1 | 1 | 0 | 1 | 0 | 1 |
| 7 | 1 | 1 | 1 | 0 | 1 | 0 | 1 |
| 8 | 0 | 0 | 0 | 1 | 1 | 0 | 1 |
| 9 | 1 | 0 | 0 | 1 | 1 | 0 | 1 |
| 10 | 0 | 1 | 0 | 1 | 1 | 0 | 1 |
| 11 | 1 | 1 | 0 | 1 | 0 | 0 | 1 |
| 12 | 0 | 0 | 1 | 1 | 1 | 1 | 0 |
| 13 | 1 | 0 | 1 | 1 | 0 | 1 | 0 |
| 14 | 0 | 1 | 1 | 1 | 1 | 0 | 0 |
| 15 | 1 | 1 | 1 | 1 | 0 | 0 | 0 |

The gates are arranged so that the X, Y, and Z signals take on values during counter states 8–15 which are the mirror image of the values presented during counter states 0 through 7. A positive X, Y, or Z signal will result in transistors $Q_1$, $Q_5$, or $Q_9$ respectively being turned on. This in turn will lower the base voltage of transistors $Q_2$, $Q_6$, or $Q_{10}$ to switch these transistors on and thus provide positive signals to the gates of unijunction transistors $Q_3$, $Q_7$, $Q_{11}$, $Q_4$, $Q_8$, or $Q_{12}$. Various ones of the resistors $R_{27}$ through $R_{32}$ are connected across pins 5 and 6 of the filters in this manner to linearize successive filter center frequencies.

A clock frequency is provided by clock 60 such that the counter will cycle through its 16 possible states five times during the period of time in which the two simultaneous tones are broadcast. If during one of these cycles the filters 35 and 40 simultaneously detect input signals of appropriate frequency, one shot multivibrator 70 will be activated by NOR gate 30. The one shot will thus provide a signal to NOR gate G9 and preclude further transmission of clock pulses to counter 65. This will cause counter 65 to cease its cyclic state change with the result that the center frequencies of the HI and LOW filters will be set to detect subsequent frequency alternations. The one shot multivibrator 70 will provide an output on line 61 sufficient in duration to preclude the center frequency of the filters from being changed during a period of time necessary to receive an entire message.

As shown in FIG. 4, refinement is possible whereby the one shot 70', corresponding to one shot 70 shown in FIG. 3, is a retriggerable multivibrator and retriggering is controlled by decoder 20. In such a refinement the decoder would provide retrigger pulses of sufficient frequency to maintain an output on line 61 as long as the decoder was receiving valid data. Thus if two extraneous signals were simultaneously received by the HI and LOW filters, the receiver would not be disabled from cyclic scanning for a significant time period. The decoder 20 would simply not provide pulses to one shot 70 when valid data failed to follow receipt of the two tones and, as a result, gate G9 would be quickly enabled to pass clock pulses to counter 65.

Below is a table listing typical component values when transmitted frequencies are 1300 Hz and 1820 Hz for the preferred embodiment of the instant invention

| ELEMENT | VALUE |
|---|---|
| $R_1$, $R_2$, $R_3$, $R_4$, $R_5$, $R_6$, $R_7$, $R_8$, $R_9$, $R_{10}$, $R_{11}$ | 1 K ohms |
| $R_{12}$, $R_{13}$, $R_{14}$ | 10 K ohms |
| $R_{15}$, $R_{16}$, $R_{17}$ | 2.2 K ohms |
| $R_{18}$, $R_{19}$, $R_{20}$ | 100 K ohms |
| $R_{21}$, $R_{22}$, $R_{23}$, $R_{24}$, $R_{25}$, $R_{26}$ | 3.3 K ohms |
| $R_{27}$, $R_{28}$ | 180 K ohms |
| $R_{29}$, $R_{30}$ | 300 K ohms |
| $R_{31}$, $R_{32}$ | 510 K ohms |
| $R_{33}$ | 6.684 K ohms |
| $R_{34}$ | 13.931 K ohms |
| $C_1$, $C_5$ | .00285 μfd. |
| $C_2$, $C_6$ | .0057 μfd. |
| $C_3$, $C_7$ | .0114 μfd. |
| $C_4$, $C_8$ | .0228 μfd. |
| $C_9$ | .0748 μfd. |
| $C_{10}$ | .047 μfd. |
| $C_{15}$, $C_{16}$, $C_{17}$, $C_{18}$ | .1 μfd. |
| HI Filter | Synetrics NE-567 |
| LOW Filter | Synetrics NE-567 |
| COUNTER | SN7493 |
| G1, G2, G3 | SN7486 |
| G4, G5, G6, G8 | SN7400 |
| G7, G9, 30 | SN7402 |

While the form of apparatus herein described constitutes a preferred embodiment of the invention, it is to be understood that the invention is not limited to this precise form of apparatus, and that changes may be made therein without departing from the scope of the invention.

What is claimed is:

1. A single-sideband system in which at least part of the information is broadcasted as transitions between two frequencies by a single-sideband transmitter, after the two frequencies are simultaneously broadcast, comprising:

first means for scanning a first range of frequencies and for providing a first output when a signal is sensed, second means for scanning a second range of frequencies and for providing a second output when a signal is sensed, gate means, responsive to the simultaneous occurrence of said first and second outputs, for supplying a control signal, control means, responsive to said control signal, for controlling the scanning frequencies of said first and second means and for halting said frequency scanning in response to said control signal, and decoder means, responsive to said first and second means, for sensing said transitions between two frequencies.

2. The system of claim 1 wherein said control means comprises:

a source of clock signals, a binary counter, and

7. A single-sideband system for processing information, where information includes a sequence of transitions between two tones following an initial simultaneous transmission of the two tones, comprising:

a receiver for providing an audio signal output, first adjustable filter means, responsive to a first range of frequencies determined by the connection of an impedance to said filter, for providing an output when said audio signal output is within said first range, second adjustable filter means, responsive to a second range of frequencies determined by the connection of an impedance to said filter, for providing an output when said audio signal output is within said second range, first gate means responsive to simultaneous outputs from said first and second adjustable filter means 11. The system of claim 8 wherein said gate means terminates said frequency varying mode of operation for a predetermined period of time.

* * * * *